United States Patent [19]

Martin et al.

[11] Patent Number: 4,495,480

[45] Date of Patent: Jan. 22, 1985

[54] MULTIPATTERN ELECTRIC COMPONENT CONNECTING PIN BASE PLATE MOUNTING ASSEMBLY

[75] Inventors: George L. Martin, Bricktown; Howard G. Melick, Toms River, both of N.J.

[73] Assignee: Inresco, Inc., Brick, N.J.

[21] Appl. No.: 331,595

[22] Filed: Dec. 17, 1981

[51] Int. Cl.³ .............................................. H01H 1/06
[52] U.S. Cl. .................................. 335/199; 336/192; 361/405; 361/419
[58] Field of Search ............. 335/199, 202, 151, 152, 335/154; 336/192, 228; 338/197, 315; 337/297; 361/331, 334, 380, 392, 395, 400, 404, 405, 406, 417, 419; 200/292

[56] References Cited

U.S. PATENT DOCUMENTS

| | | | |
|---|---|---|---|
| 3,167,625 | 1/1965 | Russo | 335/154 |
| 3,308,408 | 3/1967 | Plice | 335/151 |
| 3,340,436 | 9/1967 | Jones | 361/392 |
| 3,439,302 | 4/1969 | Perreault | 335/152 |
| 3,483,491 | 12/1969 | Weber | 335/151 |
| 3,603,907 | 9/1971 | Weber | 335/151 |
| 3,940,722 | 2/1976 | Fox | 335/202 |

*Primary Examiner*—G. P. Tolin
*Attorney, Agent, or Firm*—Eugene E. Renz, Jr.

[57] ABSTRACT

A novel approach for mounting electrical components, particularly reed switch type relays, on printed circuit boards to accommodate and positionally match contact pins, which are operatively connected to the component terminals, to a fixed pattern of openings on the printed circuit boards. The method system and apparatus of the invention provide the advantages of a simple, high volume, low cost manufacturing system of components and mounting contact pins while allowing substantial flexibility in the contact pattern. A relay user can optimize a circuit design without requiring a completely custom designed and constructed relay to operatively mate with a given circuit board opening pattern. The contact pin arrangement, i.e., the component contact pin "foot print" is obtained by inserting the contact pins of a completed component in a desired pattern of openings in a separate segment or piece of unclad circuit board base plate, the openings therein having been preformed to match the circuit board opening pattern. The component is mounted to the base plate, constituted in part by the segment of unclad circuit board, with the "foot print" pattern of openings therein, and an appropriately completed unit is thereafter easily mountable on a circuit board, with the openings therein mated by the component contact pins to fit the circuit on the circuit board.

6 Claims, 11 Drawing Figures

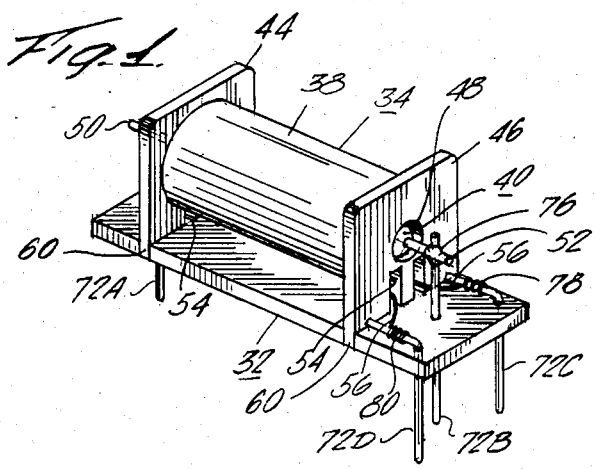
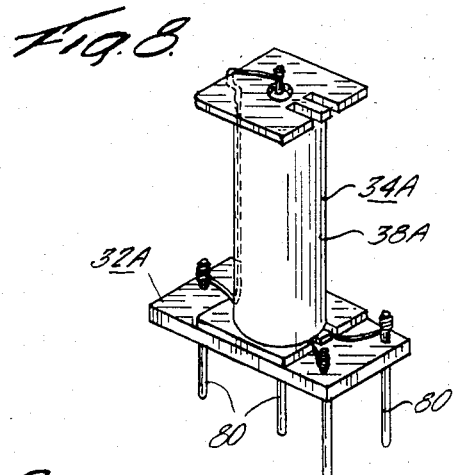
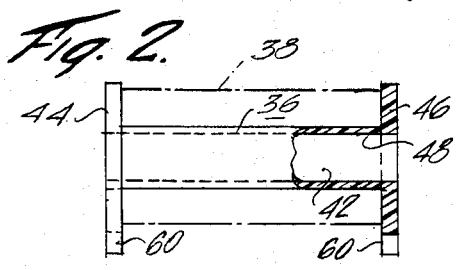
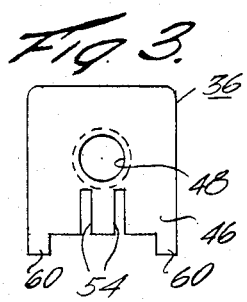
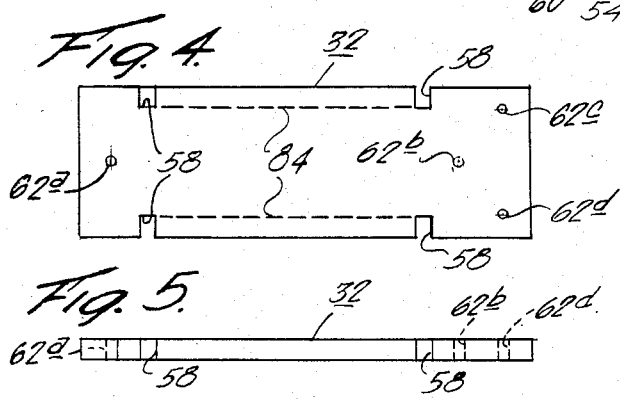
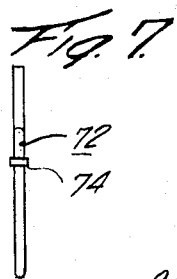
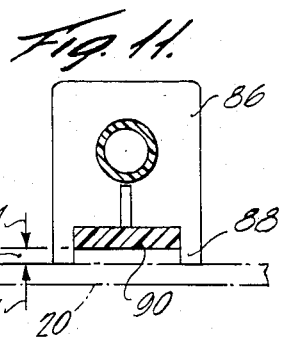
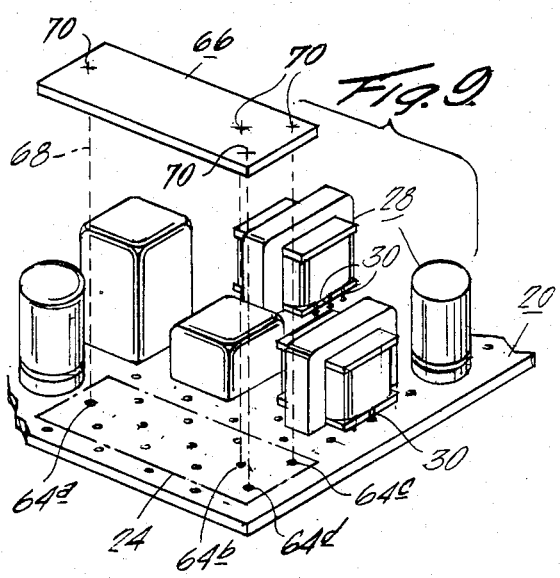
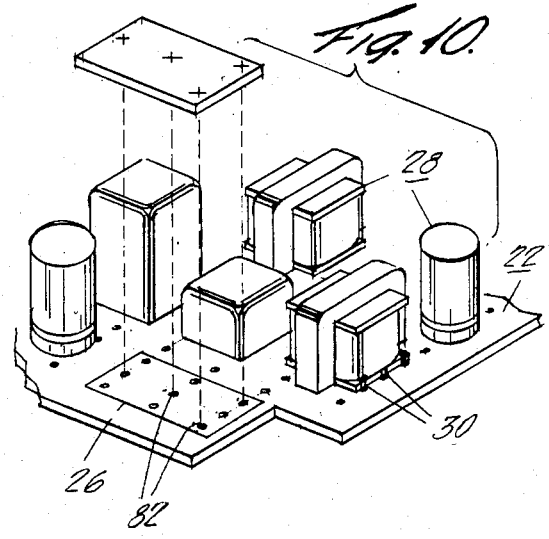

4,495,480

MULTIPATTERN ELECTRIC COMPONENT CONNECTING PIN BASE PLATE MOUNTING ASSEMBLY

TECHNICAL FIELD

The invention relates generally to circuits and more particularly to printed circuits (PC) used therewith and which include a substrate or printed circuit board, having a pre-determined pattern of printed wiring therein, and adapted to mount electrical or electric components thereon of various types, to complete a desired and designed electric circuit.

Printed circuit boards normally include a plurality of holes or openings therethrough in predetermined patterns and adapted for insertion therethrough of contact pins which are operatively connected to electrical or electronic component terminals for contact with the circuit pattern on the circuit board.

The printed circuit boards in current usage have a predetermined pattern, of openings formed therein, and designed for a specific circuit. Electrical or electronic components of different types, sizes and forms, are mountable on the printed circuit board. The circuit pattern designs vary considerably and replacement components must have the same pattern to be operatively connectible with the board pattern. Frequently, variations in size, shape, etc. of these components vary so that the pattern of the contact pins forming a "foot print" of the component do not normally match with the openings in given printed circuit board patterns.

The present invention is principally directed to means overcoming difficulties encountered by variations of the "foot prints" of the components and, more specifically, to pre-assemble the components on a base plate assembly having a predetermined and preformed pattern of openings therethrough for various types, sizes, configurations, etc. of electric components, and through which printed circuit board component connecting contact pins are insertable, and which appropriately mate or match with the predetermined opening pattern of the printed circuit board. The present invention permits total flexibility in the pin pattern of the components, and therefore more flexibility in the initial design of the PC board and in a more compact fashion.

While the concept of the present invention is broadly adapted for use with different types, sizes and shapes of electrical or electronic components and their adaptability for mounting in matching and mating alignment with patterned openings in a printed circuit board, the invention is especially suitable for the mounting of reed switch type relays on printed circuit boards to accommodate and positionally match the contact pins thereof, which are operatively connected to the component terminals, into the printed circuit on the board. In accomplishing this end result, the reed switch type relay, substantially regardless of size, shape, terminal configuration, etc., can be premounted on a base plate with the contact pins thereof prepositioned or arranged to mate with the openings pattern on a printed circuit board.

While the following detailed description of embodiments of the invention will be primarily directed to use with reed switch type relays, it will be readily understood that the principles are applicable in a much broader usage.

BACKGROUND OF THE INVENTION

Electric and electronic components utilized in circuits of integrated circuits and in connection with printed circuit boards vary widely in shapes and sizes. An example is reed relays, which are made in a wide variety of shapes and sizes. Reed relays are frequently mounted on printed circuit boards for use. Such reed relays do have some features which are common to all reed relays and are necessary for their function. These include: a coil wound on a form in the nature of a bobbin, a reed switch of known type inserted in the form either before or after winding, and a means for connecting the coil and switch leads to the circuit for operation.

There are almost an infinite variety of so-called "foot prints", i.e. the pattern of the contact pins on the relay, in use. There are two general types of assemblies, including an axial assembly in which the leads are bent at right angles to insert in the holes or openings formed in a predetermined pattern in the PC board; a second type of assembly uses a molded bobbin in which the contact pins are an integral part of the bobbin. While the axial design offers flexibility in the mounting pattern over a limited range, the molded bobbin approach provides substantially no flexibility at all in the mounting pattern. If a new "foot print" is desired, a new bobbin must be selected or designed to fit the opening pattern of the board. This can be both expensive and time consuming since a new design and new tooling may be required. Typically, the cost can be in the neighborhood of several thousand dollars and a time period of four to six months can elapse before a new mold is usable for producing the desired part. As a result, compromises are often made by choosing a bobbin for which the tooling exists, even though it may be far from ideal for the desired application.

This prior existing problem is overcome by means of the present invention. The present concept negates the problems arising from a different "multi foot print" by separating a component or bobbin design from the "foot print" selection. The manner in which this is accomplished will be set forth in detail hereinafter, especially as applied to reed type relays, but applicable to other components. Generally speaking, the invention contemplates providing the component "foot print" by means of preforming openings, in a pattern conforming with those on the PC board, on a segment or piece of unclad circuit board base plate into which component contact pins are inserted in the preformed pattern. Thus the mounted component pattern corresponds to the pattern of openings on the PC board to which the component is to be mounted. In use, the only required changes to match a specific "foot print" reside in the size of the board and in the pattern of the holes therein. No expensive tooling or time consuming design is required. A simple jig or pattern is all that is required for manual drilling of the holes in the base plate or a small program change for N/C controlled machine.

While the present invention will be specifically described in preferred constructional forms, the invention, obviously, is not limited thereto and variations and specifics of constructional details and materials will be obvious and within the scope of the invention.

SUMMARY OF THE INVENTION

The present invention is broadly directed to a novel approach for mounting of electrical components and particularly reed switch type relays on printed circuit boards having a predetermined pattern of openings thereon commensurate with the circuit formed thereon.

More specifically, the invention is directed to permitting substantial or complete flexibility in the pin pattern for electrical components such as reed relays, for PC board mounting.

The "multi foot print" concept of the invention separates the bobbin design from the "foot print" selection. Reed switches, for example, are designed with reasonable uniformity in diameter and length. Three or four bobbin designs are normally adequate to give almost complete flexibility for different switches and to provide space for variation of coil size that may be required. This greatly reduces costs in the bobbin manufacture and also permits standardization of design and manufacture of the coil. The combination provides for high efficiency and lower costs. A minimum of changes are required to match a specific "foot print", namely the size of the board and the pattern of holes. The present invention accomplishes this end result in a highly improved and unobvious manner. Patterns on existing circuit boards can be precisely matched so that no changes are required to use a second source of supply, or by attachment of a separate section or an additional board piece to the printed circuit board used. A relay can be modified or upgraded without any redesign of the board connections. The relay can be designed to fit the pattern and space available for a new circuit. Almost any pin arrangement and spacing can be provided, for example, SIP, DIP, 0.100 spacing, dimensional spacing, traditional 1.125 length, namely, whatever is desired or required.

The old or traditional approach to reed relay manufacture places many constraints on the user. The relay form usually contains the contact pins in a specific PC board design. Axial designs come in a narrow range of lengths. Because of tooling costs and volume production efficiencies, the relay manufacturers have offered a limited number of options in pin patterns. Different manufacturers have often chosen to emphasize different patterns, leaving the user with a single source for a particular reed relay unless the circuit was redesigned.

The present invention teaches a relay form which solves these problems by separating the bobbin from the pin arrangement. Economy in bobbin manufacture is achieved by using a limited number of sizes which are selected to fit the reed switch sizes available. The pin pattern is placed on a small segment or piece of board, preferably unclad PC board base plate, utilizing established circuit board techniques; the bobbin is then mounted on the board; and finalled to a completed relay. The user can have the cost advantage of volume production while retaining the flexibility of choosing a specific pin pattern. The switch series can be offered in a wide variety of switch and coil specifications adapted for specific applications and variations of circuit designs. As a matter of fact, with the flexibility provided by the present invention, almost any reed relay performance and pin pattern can be provided.

BRIEF DESCRIPTION OF THE DRAWINGS

The accompanying drawings illustrate preferred embodiments of the invention and, when taken together with the description, serve to explain the principles and structure of the invention.

In the drawings

FIG. 1 is a perspective view of a reed relay of a particular type, longitudinally operatively mounted to a base plate, with the connecting pin pattern arranged in a predetermined pattern for mating with the openings pattern on a given PC board;

FIG. 2 is a side elevational view of the bobbin shown in mounted position in FIG. 1, with parts broken away for clarity;

FIG. 3 is an elevational view of an end plate to which the bobbin is mounted and which adapts the relay for mounting on the base plate;

FIG. 4 is a plan view of a base board or plate to which the relay of FIG. 1 is mounted, and disclosing constructional features adapting it for its use in the present invention;

FIG. 5 is a side view of the base plate of FIG. 4;

FIG. 6 is a pictorial view of a reed type switch of a known type incorporating a sealed tube into which the two segments or strips of relay contacts are mounted, the envelope being adapted for mounting interiorally of the bobbin which thereafter is appropriately wire wound to form the coil of the relay;

FIG. 7 is a view of a pin connector adapted for operative connection to the terminals of the relay coil and for insertion in the openings in the PC board for incorporation in the circuit thereof;

FIG. 8 is a perspective view of a modification of the embodiment shown in FIG. 1 with the relay being vertically mounted to a base plate and adapted for placement on a PC board in a confined or small position area thereon;

FIG. 9 is an exploded view of a printed circuit board, disclosing an opening pattern thereon and electronic components mounted thereto, a plate pattern of the present invention being disclosed in a displaced position from the board prior to the mounting of the relay on the board;

FIG. 10 is a view similar to FIG. 9 disclosing a different pattern on the printed circuit and, additionally, showing a segment being removed and adapted for application of the design of FIG. 8 in a limited space; and FIG. 11 is a view similar to FIG. 3, disclosing a modification of substantial significance, providing improvided stability and facilitating cleaning.

DETAILED DESCRIPTION OF PREFERRED EMBODIMENTS

The invention, and the principles thereof, are shown in the drawings, and will be described with respect to incorporation or use of a reed switch type relay mounted on a printed circuit board having a specific pattern of mounting openings therein. According to the invention, these openings are adapted to receive contact pins which are operatively connected to the terminals of a relay or the like and to connect the relay or component into the printed circuit on the board in a known manner.

Reed type relay switches are known in the art and some known types include structures which permit their mounting on printed circuit boards. None of the prior known devices, however, have incorporated the principles of the present invention which offers the user substantially complete flexibility in the pin pattern for printed circuit board mounting. Reed switch relays are shown, for example, in prior U.S. Pat. Nos. such as 3,167,625, J. E. Russo, wherein the coil is affixed directly to a plate and extensions are provided for contacts, but no predetermined pattern is formed nor the switch mounted on a base plate contemplated by the invention; 3,308,408, granted to G. W. Plice; 3,439,302, granted to G. E. Perreault, both of which disclose, generally, reed relays and mountings therefor but which, again, fail to disclose the predetermined pattern for the contact pins on the base plate as in the present invention; J. Weber, U.S. Pat. Nos. 3,483,491 and 3,603,907, each of which disclose reed type relays mounted to support members, but neither of which define "foot print" openings in a base plate as in the present invention, the construction in these patents preventing the same. Many other patents generally disclose reed relays having connecting means for mounting of the same, but none incorporate or suggest the underlying concept of the present invention of the predetermined pattern of the openings in the base mounting plate corresponding to the openings in the printed circuit board pattern.

Referring initially to FIGS. 9 and 10 of the drawings, printed circuit boards 20,22 are respectively shown and which specifically incorporate different pattern openings, as are shown within the broken line portions 24, 26 thereon. A plurality of electronic components, generally indicated at 28, are mounted on the printed circuit boards in operative positioning and connection with the circuit carried by the board. Mounting of the components is accomplished by means of terminal contact pins such as shown at 30 on some of the components. It is to be noted that the construction and arrangement of the terminal contact pins on these electronic components must be so designed as to correspond to the openings on the printed circuit boards. A change in printed circuit board openings, or a change in size, shape, etc. of the components of necessity might require a complete restructuring of the board or component. This drawback is overcome by the present invention.

In FIG. 1 there is disclosed one form of the present invention. This incorporates a base board or plate 32 of generally rectangular configuration and to which is mounted a reed switch type relay generally designated 34, which consists of a hollow bobbin 36 (FIG. 2) around which an electric coil consisting of wire windings in a known manner is provided, as indicated at 38. A reed relay switch portion 40 (FIG. 6) is operatively mounted in the hollow interior 42 of bobbin 36. This bobbin contains end plates or members 44, 46, having openings such as at 48 therein. A lead or connector, 50 or 52, of the switch 40 pass through these openings and are adapted for connection with PC board connecting pins as will be described hereinafter.

The end plates are provided with notches or slits at 54 through which terminal ends 56 of wires forming the coil 38 can extend. The base plate or board 32, in the form shown in FIG. 4, is provided with four spaced notches 58. Each of the end plates 44, 46 include depending tangs or projections 60 (FIG. 3) which extend into the notches 58 in the base plate 32 and are secured in any desired manner, such as by adhesion or plastic coating or the like. This intercoaction of the tangs and notches mounts the relay coil and other components of the switch to integrate the same.

The base plate 32 (FIG. 4) has a plurality of openings or holes 62A, 62B, 62C and 62D drilled therethrough. The arrangement or positioning of these openings are made to correspond with the openings 64A, 64B, 64C and 64D, which constitute openings in the PC board 20 and arranged in a predetermined pattern therein. In order that the openings in base plate 32 correspond with the openings in the PC board 20, one method can consist in utilizing a piece of scrap material, such as 66 in FIG. 9, shown removed by dashed lines 68 from the broken line pattern showing 24. When positioned as at 24, the scrap 66 can be marked with a plurality of indicator marks 70 which conjointly conform to the configuration of the openings in the PC board. The scrap can consist of any material of appropriate size, shape, etc. and have holes or openings drilled therethrough at the marked positions 70. This scrap or piece can then be used as a template for marking a base plate 32 for similar drillings therethrough to form holes 62A-62D.

A plurality of contact pins such as shown at 72 in FIG. 7, preferably having an intermediate collar 74, dividing the pin into upper and lower portions, are respectively passed through the openings in the base plate 32 and are indicated respectively at 72A, 72B, 72C and 72D. The lower ends of the pins extend below the base plate with the collar being utilized for positional placement thereof. This in itself constitutes a placement of the pins by abutment of the collar 74 against the undersurface of the base plate. The upper ends or portions of the pins 72A and 72B extend to and are connected respectively with connectors 50, 52 of the reed switch, and preferably at the point of contact are welded thereto as indicated at 76. The upper ends of pins 72C, 72D are initially respectively soldered to terminal wire ends 56 of the coil as at 78, 80 (FIG. 1) and thereafter these upper ends may be bent into the position shown in FIG. 1, at right angles to the downwardly extended portion of the contact pins, or clipped in the manner shown in FIG. 8, described hereinafter.

The so-fabricated and assembled apparatus as shown in FIG. 1 can then easily be connected into the corresponded pattern between the contact pins and the pattern openings in the PC board as will be readily understood.

It will be seen that the concept of the present invention separates the bobbin designs from the "foot print" selection with the pin pattern being placed on a small board using established circuit board techniques. The bobbin is then mounted on this board to form the completed relay. A choice of a specific pin pattern is provided, and at the same time presenting a substantial cost advantage of volume production while retaining this flexibility. The designs can vary substantially and the improvement of the invention incorporated therein, especially since reed switches are designed with reasonable uniformity in diameter and length, and three or four bobbin designs are adequate to give almost complete flexibility for the different switches and to provide space for the variation in coil size that may be required. In other words, a wide variety of switch and coil specifications can be used and supplied, any of which can be readily affixed to a patterned PC board.

Apropos of the foregoing, reference is made to FIGS. 8 and 10. Here, a reed switch type relay 34A, including coil 38A and the same structure as shown in FIG. 1 is vertically mounted on a base plate or board 32A and the pattern of the pins 80 in this embodiment corresponds to the pattern formed by openings 82 (FIG. 10). The upper ends of pins 80 are clipped and secured to the leads. The construction and operation otherwise is similar to that previously described but with a different PC board opening pattern and with the vertical arrangement adapting the construction to a more restricted or confined area of a PC board. Smaller space requirements can, accordingly, be adapted to the invention.

Other variations and modifications can be made in these prior described embodiments, and these have important aspects of use and contribute to the overall flexibility and improvements of the invention.

In FIG. 4, for example, dotted lines at 84 indicate portions of the board 32 which can be cut away, over and beyond the notches 58, with a resultant I-shaped board. This configuration reduces the area occupied by the relay so that other components can be more closely spaced. A still further modification would result from eliminating cut out notches or portions altogether. The end member legs could be eliminated, or appropriately mounted on the board face.

FIG. 11 discloses a further embodiment which has significant features. The end members 86 are provided with depending legs 88 which are comparatively longer than the projections 60 of FIG. 3. The length of the legs 88 is such that portions 88A thereof extend beyond or below base board 90. The extending length is indicated by space 92 between arrows 94.

This latter construction accomplishes additional favorable use factors. It provides a stable mount before soldering. The relay is not resting on the pin flanges, but on four legs. This arrangement is better for wave or other type of soldering and cleaning. There is little chance for flux or debris to be trapped under the relay.

What is claimed is:

1. An electronic component mounting assembly mounting an electronic component on a printed circuit board in operative connection with the circuit printed thereon, wherein said printed circuit board has a first plurality of openings in a predetermined pattern, comprising:
   a base plate having a plurality of holes therethrough formed in a pattern corresponding to said predetermined pattern of openings on said printed circuit board
   an electronic component comprising a reed switch relay assembly mounted on said base plate, said reed switch relay assembly comprising
   a hollow bobbin member,
   a reed switch relay operatively contained within said hollow bobbin member and having switch contact end terminals extending outward from the ends of said bobbin,
   a coil operatively surrounding said bobbin and having two terminal ends extending therefrom, and
   end plates attached to each end of said bobbin member, said end plates having openings through which extend said switch contact end terminals, and means for positioning said switch and coil substantially parallel on and above said base plate; and
   contact pins inserted through said respective base plate holes and having upper ends operatively connected to said switch contact end terminals and said terminal ends of said coil.

2. The mounting assembly as claimed in claim 1, further comprising a group of notches which comprise extended cutouts in opposite side edges of said base plate whereby said base plate is I-shaped.

3. The mounting assembly as claimed in claim 1, further comprising tangs which are greater in length than the depth of said base plate, and wherein said tangs further comprise end portions extending below said base plate in a mounted position thereon, said end portions serving as a stable mount before a soldering operation with the relay resting on said end portions rather than on portions of said contact pins and further spacing said reed switch relay assembly from said printed circuit board decreasing flux entrapment under the relay and facilitating cleaning.

4. The mounting assembly as claimed in claim 1, wherein said coil has a plastic protective covering therearound.

5. The mounting assembly as claimed in claim 1, wherein said terminal ends of said coil extend beyond only one end of said bobbin.

6. The mounting assembly as claimed in claim 1, wherein said contact pins which are electrically connected to said terminal ends of said coil are angularly bent into substantial aligned contact with the upper surface of said base plate.

* * * * *